United States Patent
Blake et al.

(10) Patent No.: US 8,930,616 B2
(45) Date of Patent: *Jan. 6, 2015

(54) SYSTEM REFRESH IN CACHE MEMORY (71) Applicant: International Business Machines Corporation, Armonk, NY (US)

(72) Inventors: Michael A. Blake, Wappingers Falls, NY (US); Timothy C. Bronson, Round Rock, TX (US); Hieu T. Huynh, Pflugerville, TX (US); Kenneth D. Klapproth, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 30 days.

This patent is subject to a terminal disclaimer.

(21) Appl. No.: 13/655,053

(22) Filed: Oct. 18, 2012

(65) Prior Publication Data

US 2013/0061001 A1 Mar. 7, 2013

Related U.S. Application Data (63) Continuation of application No. 12/822,361, filed on Jun. 24, 2010.

(51) Int. Cl.
*G06F 12/02* (2006.01)
*G06F 13/16* (2006.01)
*G11C 11/406* (2006.01)
*G06F 13/14* (2006.01)
*G06F 12/08* (2006.01)

(52) U.S. Cl.
CPC ........ *G06F 12/0897* (2013.01); *G06F 13/1636* (2013.01); *G11C 11/40618* (2013.01); *G11C 11/406* (2013.01); *G06F 13/16* (2013.01); *G11C 11/40607* (2013.01); *G06F 13/14* (2013.01); *G06F 13/1605* (2013.01); *G11C 11/40603* (2013.01)
USPC ............... 711/106; 711/5; 711/105; 711/118; 711/154; 365/185.25; 365/222

(58) Field of Classification Search
USPC ......... 711/5, 105, 106, 118, 154; 365/185.25, 365/222
See application file for complete search history.

(56) References Cited

U.S. PATENT DOCUMENTS

| 4,924,381 | A  | * | 5/1990  | Tokuume ...................... 711/106 |
|-----------|----|---|---------|----------------------------------------|
| 5,682,498 | A  | * | 10/1997 | Harness ........................ 711/106 |
| 7,088,632 | B2 | * | 8/2006  | Pelley ........................... 365/222 |
| 7,649,796 | B2 |   | 1/2010  | Okuda et al. |
| 2002/0141256 | A1 | * | 10/2002 | Barri et al. ..................... 365/200 |
| 2003/0046509 | A1 | * | 3/2003  | Corti et al. ..................... 711/202 |
| 2005/0210186 | A1 | * | 9/2005  | Arakawa et al. .............. 711/106 |
| 2006/0221744 | A1 | * | 10/2006 | Lee ................................ 365/222 |
| 2008/0062797 | A1 | * | 3/2008  | Hearn et al. ................... 365/222 |
| 2009/0141575 | A1 | * | 6/2009  | Kohler et al. ................. 365/222 |
| 2009/0150629 | A1 |   | 6/2009  | Noguchi et al. |
| 2010/0211748 | A1 | * | 8/2010  | Perego et al. ................. 711/148 |

* cited by examiner

*Primary Examiner* — Arpan P. Savla
(74) *Attorney, Agent, or Firm* — Cantor Colburn LLP; Margaret McNamara (57) ABSTRACT

System refresh in a cache memory that includes generating a refresh time period (RTIM) pulse at a centralized refresh controller of the cache memory and activating a refresh request at the centralized refresh controller based on generating the RTIM pulse. The refresh request is associated with a single cache memory bank of the cache memory. A refresh grant is received and transmitted to a bank controller. The bank controller is associated with and localized at the single cache memory bank of the cache memory.

20 Claims, 8 Drawing Sheets

FIG. 8

SYSTEM REFRESH IN CACHE MEMORY

CROSS-REFERENCE TO RELATED APPLICATION

This application is a continuation of U.S. patent application Ser. No. 12/822,361, filed Jun. 24, 2010, the content of which is incorporated by reference herein in its entirety.

BACKGROUND

This invention generally relates to cache memory, and in particular, to system refresh in cache memory.

Embedded dynamic random access memory (EDRAM) requires periodic refresh operations to retain contents of memory cells. The period of the required refresh operations varies depending upon system temperature and voltage level. In a relatively large cache system, there may be considerable distance and latency separating a cache controller from the cache itself. The distances and larger number of EDRAM macros associated with large caches may provide added difficulties with regards to noise, voltage requirements, and latency. For example, if a relatively large number of EDRAM macros were to be refreshed simultaneously, a spike in noise may be formed which could affect performance of the cache memory. Additionally, supply voltage to other portions of the cache memory may be depleted in large refresh operations which may further affect performance of the cache memory. Moreover, tracking and scheduling of system refresh operations may be hindered by the increased latency between a cache control and those cache memory banks furthest away.

SUMMARY

An embodiment includes a computer implemented method of system refresh in a cache memory. The method includes generating a refresh time period (RTIM) pulse at a centralized refresh controller of the cache memory, activating a refresh request at the centralized refresh controller in response to generating the RTIM pulse, the refresh request associated with a single cache memory bank of the cache memory, receiving a refresh grant in response to activating the refresh request, and transmitting the refresh grant to a bank controller, the bank controller associated, and localized, at the single cache memory bank of the cache memory Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

An example embodiment of the present invention provides cache refresh optimized for large cache memories. According to example embodiments, a cache refresh system may include a centralized cache refresh controller disposed to track and satisfy the refresh requirements of independent cache banks. The cache refresh system employs a bank availability model which is configured to monitor command and transfer phases of operations within cache memory banks to determine bank availability, and further configured to grant refresh requests from the centralized cache refresh controller based on the monitoring and availability. The refresh request grants are communicated to bank controllers localized at each cache memory bank.

Technical effects and benefits of example embodiments of the present invention include the centralized control of system refresh operations for an entire cache memory chip including a bank availability model used in determining if a refresh command is appropriate, resulting in smaller processing pipeline gaps for refresh commands with less pipeline idle time, and increased productivity.

Figure 1:
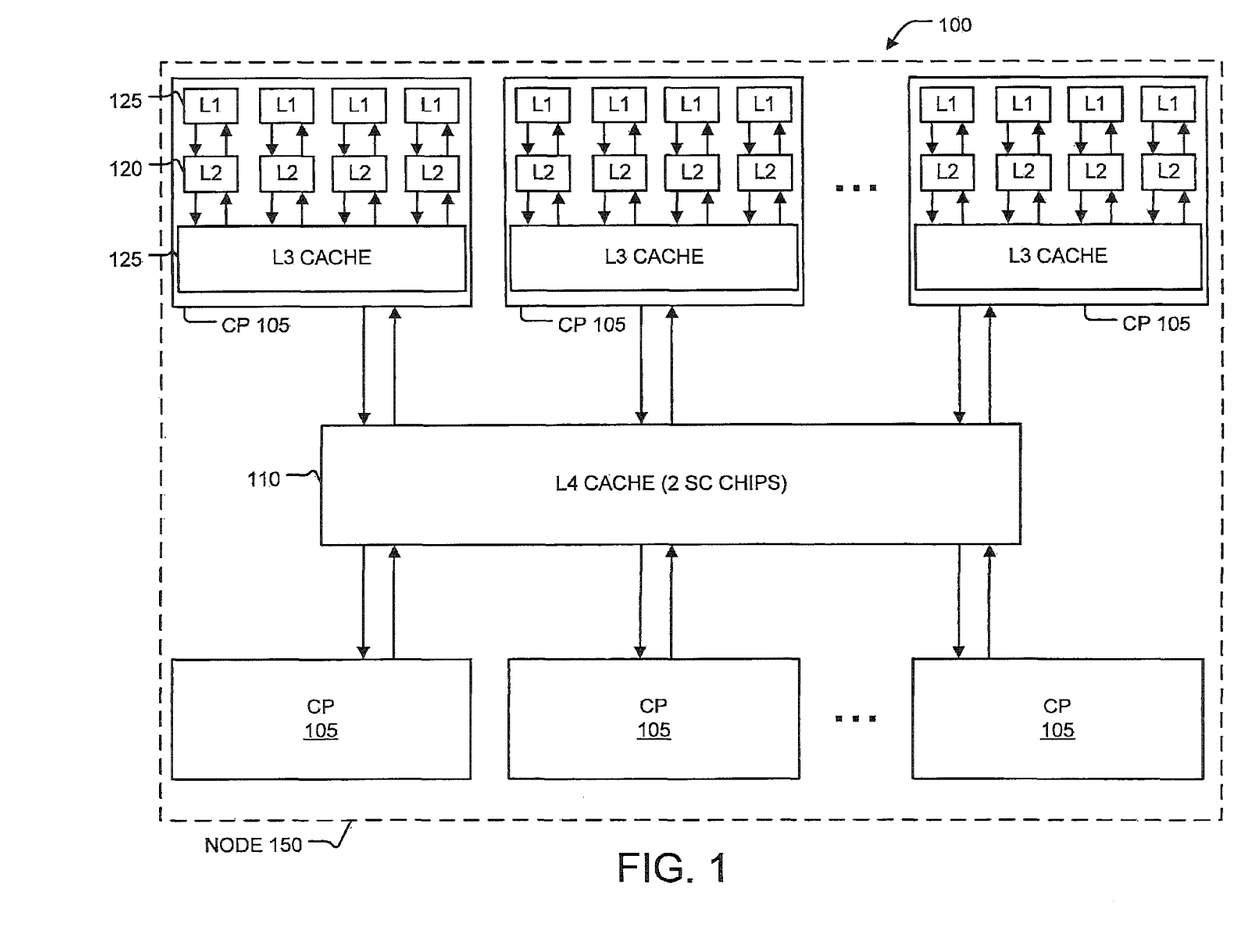
FIG. 1 depicts a state of the art cache topology.

FIG. 1 illustrates a state of the art cache topology 100. FIG. 1 illustrates a plurality of central processors (CP) 105 (e.g., central processing units) operatively connected via busses to one or more L4 caches 110. Although not shown in FIG. 1, each of the central processors 105 includes one or more cores which may perform reading and executing of instructions. On each central processor 105, the multiple cores may be operatively connected via busses to the L1, L2, and L3 caches 125, 120, and 115. The L1 caches 125 are physically closest to the cores, with the L2 caches 120 and the L3 caches 115 successively further from the cores. It is understood that the designation of caches may be reversed. Although the L3 and L4 caches 115 and 110 may comprise embedded dynamic random access memory (DRAM) which is referred to herein as EDRAM, it should be understood that any other type of suitable memory, such as DRAM, may be utilized. The plurality of central processors 105 operatively connected to the L4 caches 110 (e.g., two L4 caches) form a node 150. In a computing system, a plurality of nodes 150 may be operatively connected to one another for communications such as making and responding to requests, or any suitable operation.

Each individual central processor 105 may be fabricated on a separate chip, which may include the L1, L2, and L3 caches 125, 120, and 115. The L4 cache 110 may be fabricated on a separate chip, or a combination of separate chips. According to example embodiments of the present invention, the L4 cache 110 is formed on two (2) separate chips. Fabrication of the chips (including integrated circuits, wires, metal layers, semiconductor and/or other material components) may be facilitated through lithography and/or other suitable techniques. The fabrication process may include various deposition techniques including physical vapor deposition (PVD), chemical vapor deposition (CVD), electrochemical deposition (ECD), molecular beam epitaxy (MBE), atomic layer deposition (ALD) and/or any suitable technique.

Figure 2:
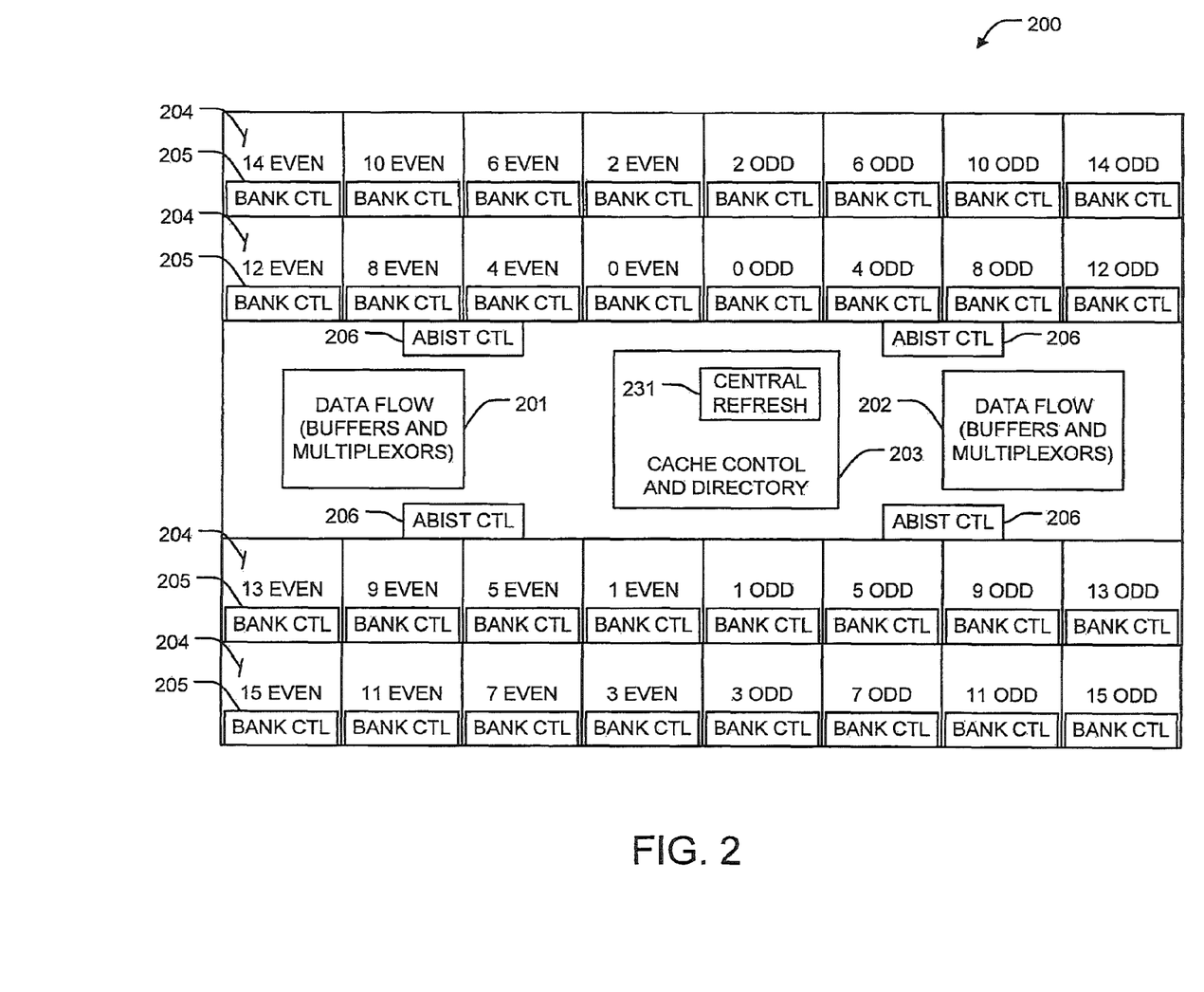
FIG. 2 depicts a logical layout of a single cache chip.

Turning to FIG. 2, a logical layout of a single cache chip is illustrated. For example, the cache may be a L4 cache. It should be understood that according to at least one example embodiment, an entire cache is divided amongst two chips, and therefore, a complete example cache would include two chips 200. A single chip 200 may include sixteen cache banks, divided into EVEN and ODD sections, labeled 0-15 EVEN/ODD (204). The cache banks 204 may each include a local bank controller 205. The local bank controller 205 may direct refresh operations for each EDRAM macro within an associated cache memory bank.

The chip 200 may also include data flow portions 201 and 202. The data flow portions 201 and 202 may include buffers and multiplexors (not illustrated for the sake of clarity) to facilitate data flow across the chip 200.

The chip 200 may further include a cache control and directory 203. The cache control and directory 203 provides control of cache reads/writes. The cache control and directory 203 includes a central refresh controller 231. The cache control and directory may also include a bank availability model (illustrated in FIG. 4) facilitating the creation of a model representing a cache bank's availability.

The central refresh controller 231 may be in communication with the plurality of bank controllers 205, the bank availability model, and the plurality of array built-in self test (ABIST) controllers 206. Therefore, the central refresh controller 231 may determine and track refresh requirements for each of the plurality of bank controllers 205, thereby facilitating system refresh commands based on a model of each bank's availability without the drawbacks of latency involved in direct requests from each cache memory bank.

Figure 3:
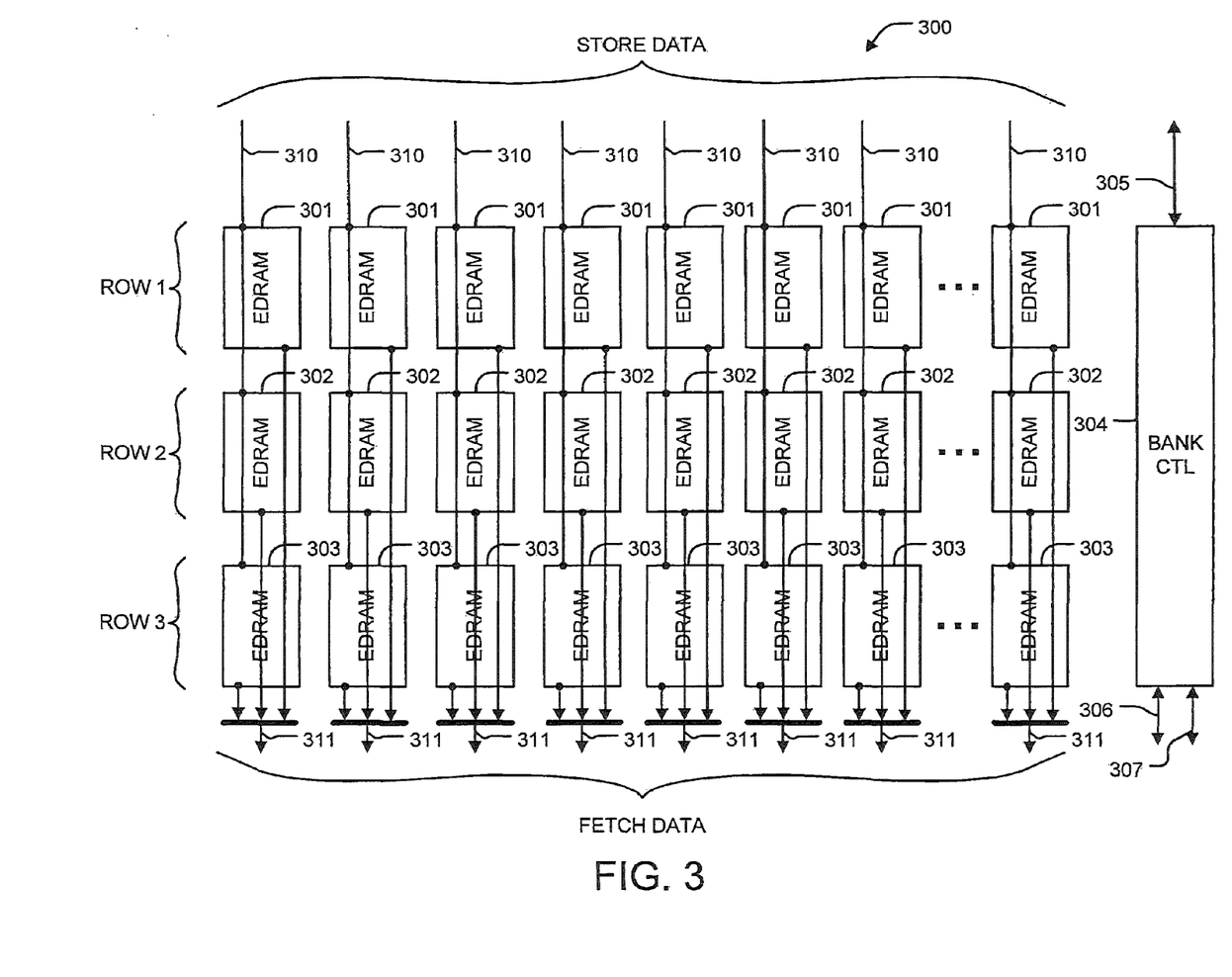
FIG. 3 depicts a logical view of a single cache bank.

FIG. 3 depicts a logical view of a single L4 cache bank. The cache bank 300 includes a plurality of EDRAM macros 301-303. The plurality of EDRAM macros 301-303 are divided into twenty-four (24) compartments arranged in three rows, labeled ROW 1, ROW 2, and ROW 3. ROW 1 includes the plurality of EDRAM macros 301, and provides eight compartments 0 through 7. ROW 2 includes the plurality of EDRAM macros 302, and provides eight compartments 8 through 15. ROW 3 includes the plurality of EDRAM macros 303, and provides eight compartments 16 through 23. Each EDRAM macro and consequently each ROW contains 1024 lines, addressable via 10 line address bits (not shown for clarity).

The cache bank 300 receives store data over a plurality of communication buses 310. The store data is stored in associated EDRAMS depending upon an associated compartment and line addresses. The cache bank 300 transfers fetched data over a plurality of communication buses 311. Each communication bus of the plurality of communication buses 310-311 may be a 16 byte wide communication bus comprised of individual 9-bit wide communication buses.

The cache bank additionally includes a local bank controller 304. The bank controller is in communication with the plurality of EDRAM macros 301-303, and may issues refresh commands for the plurality of EDRAM macros 301-303 as requests are granted by the central refresh controller 231. The bank controller 304 receives commands for functional accesses from a final pipe priority control macro over communication bus 305. The bank controller 304 receives ABIST commands from ABIST controllers over communication bus 306. The bank controller 304 receives refresh commands over communication bus 307.

Hereinafter, system refresh control is described more fully with reference to FIGS. 4-5.

Figure 4:
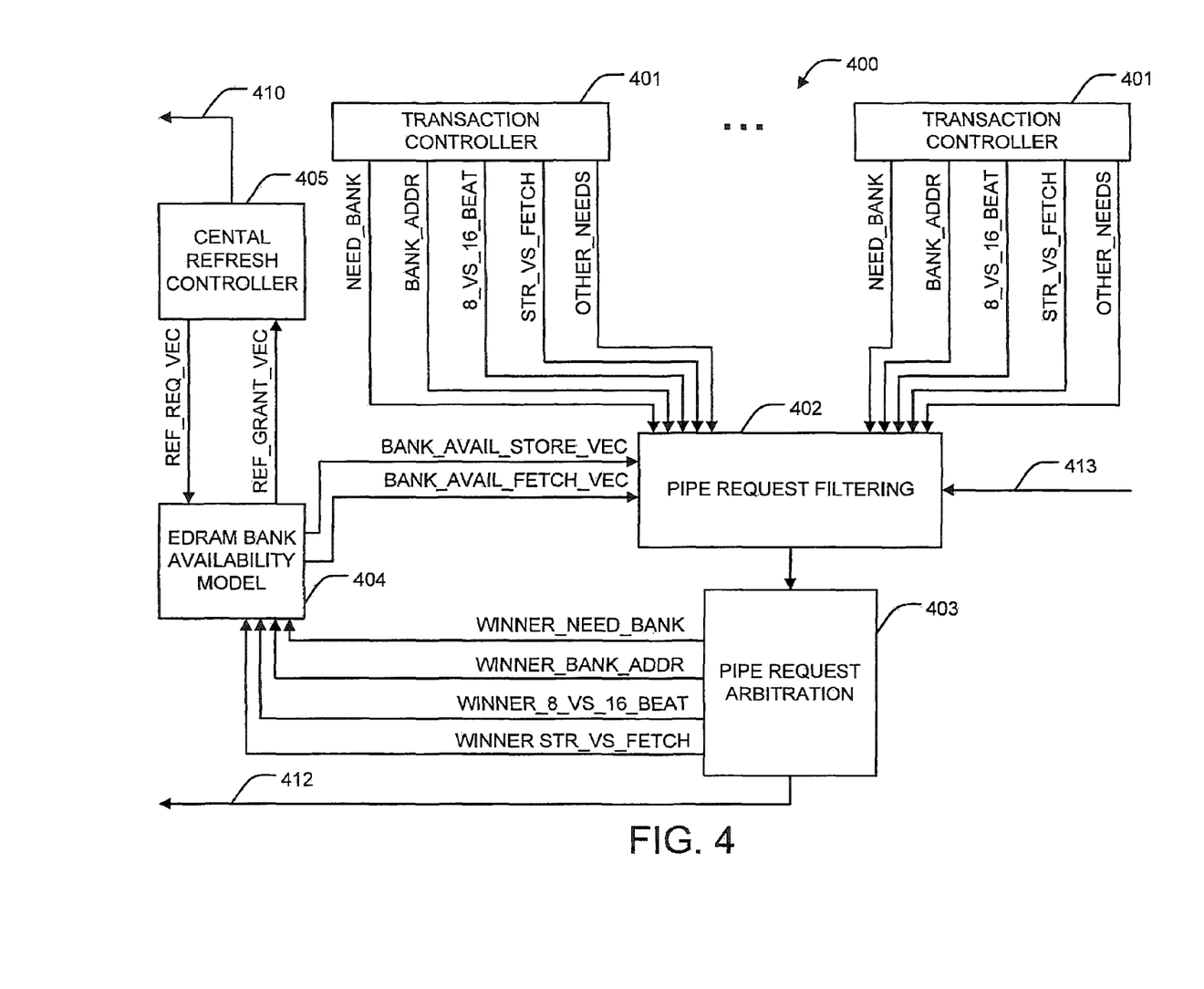
FIG. 4 depicts a cache controller with system refresh.

FIG. 4 depicts a cache controller with system refresh. The cache controller 400 may include a plurality of transaction controllers 401. The plurality of transaction controllers 401 compete for access to the cache transaction pipeline. Different types of transactions have different resource requirements for successful completion of a pipe mass.

The cache controller 400 further includes pipe request filtering unit 402 in communication with the transaction controllers 401. The filtering unit 402 filters requests based on the availability of the resources the requests require. The filtering unit 402 receives requests from the transaction controllers 401 and receives resource availability vectors from both an EDRAM availability model 404 and other resource availability vectors 413.

The cache controller 400 further includes pipe request arbitration unit 403. The arbitration unit 403 is a multi-level arbiter which is configured to choose a single filtered request for entry into the transaction pipeline for every cycle there is an active filtered request. Cache access commands from the arbitrations unit 403 are sent to bank controllers over communications bus 412.

The cache controller 400 further includes the EDRAM bank availability model 404 in communication with the filtering unit 402 and the arbitration unit 403. The cache controller 400 further includes a central refresh controller 405 in communication with the EDRAM bank availability model 404.

The bank availability model 404 receives refresh request vectors from the central refresh controller 405. The EDRAM availability model 404 transmits refresh grant vectors to the central refresh controller 405 in response to the request vectors. For example, the EDRAM bank availability model 403 provides bank availability vectors for both store and fetch operations to the filtering unit 402. Filtered requests are provided from the filtering unit 402 to the arbitration unit 403. The arbitration unit 403 provides information related to a chosen single filtered request to the EDRAM bank availability model 404, such that the EDRAM bank availability model may determine which refresh requests contained in received refresh requests vectors may be granted. Thereafter, the EDRAM bank availability model returns the granted requests as a vector to the central refresh controller 405. The central refresh controller transmits associated refresh commands to bank controllers over communication bus 410.

According to example embodiments, the bank availability model 404 tracks the cache resources needed for various operations at each cache bank. For example, a fetch operation to a bank may require multiple cycles to execute the fetch command before fetch data is available, followed by multiple cycles of data delivery on the fetch bus dedicated to that bank. Further, a store operation requires multiple cycles of data delivery on the store bus dedicated to that bank, followed by multiple cycles to execute the store command once all the data has been delivered. Further, a refresh operation requires multiple cycles to complete, but includes no data transfer cycles. The EDRAM macros (and consequently the cache bank they comprise) are capable of simultaneously accumulating store data for one operation while delivering fetch data for a different operation. Likewise, the execution of the command phase of an operation (e.g., fetch, store, or refresh) may occur during the data transfer phase of a different operation. However, the command phase of any operation may not overlap the command phase of another operation. The bank availability model 404 uses shift registers and counters to model the resource usage at a bank during the data delivery and command execution phases of all operations. Based on the operations in progress, the bank model broadcasts the bank availability vectors for every bank in the cache to the filtering unit 413. These availability vectors are used to filter requests for bank access by a plurality of cache controllers, each of which may be dynamically dedicated to a single request on behalf of a microprocessor of a computer system.

Hereinafter, a more detailed description of a central refresh controller is provided with reference to FIG. 5.

Figure 5:
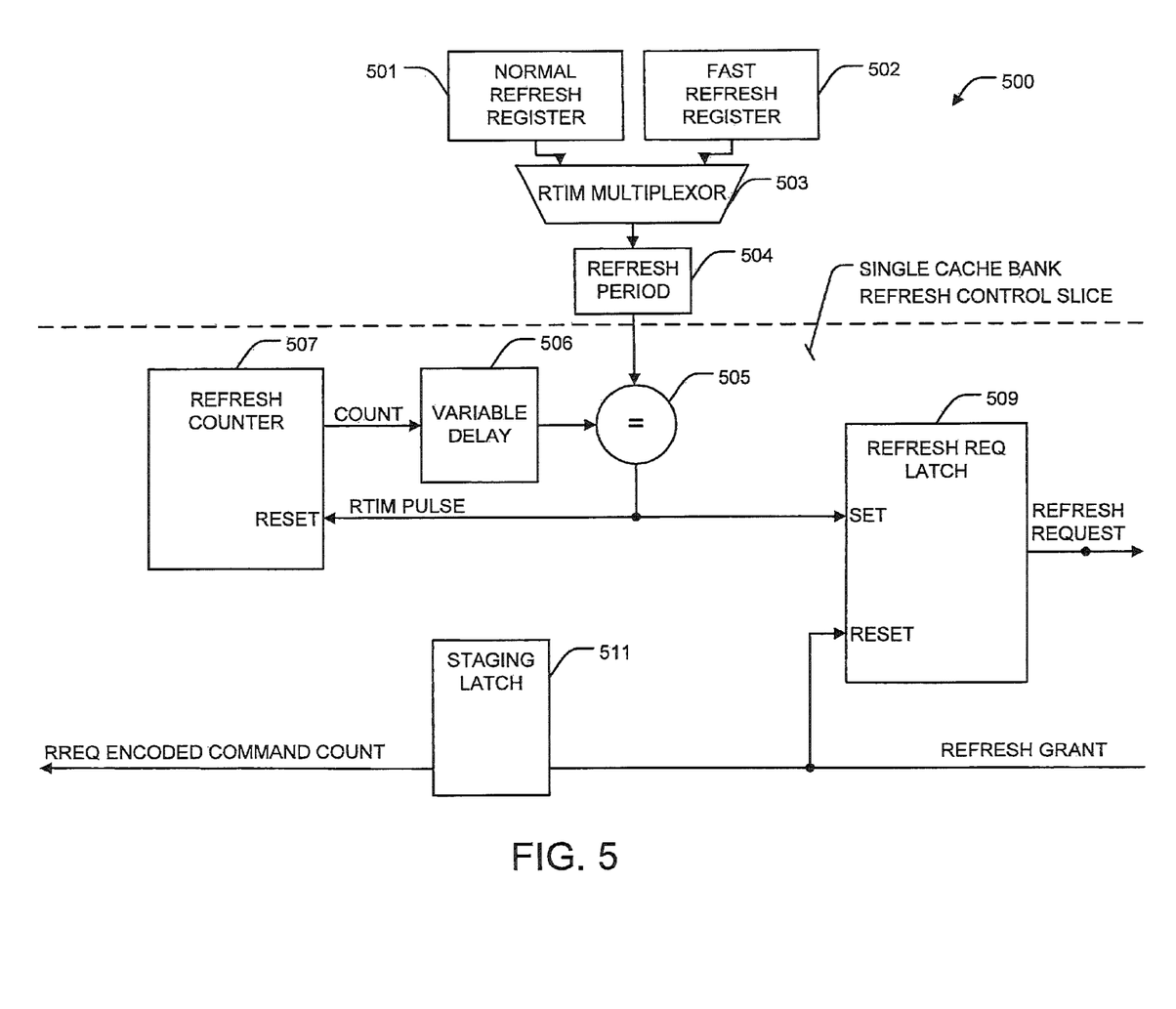
FIG. 5 depicts a central refresh controller.

FIG. 5 depicts a central refresh controller. The central refresh controller 500 may include a normal refresh register 501 and a fast refresh register 502. The normal refresh register 501 may provide a refresh frequency value for typical system operating conditions. The fast refresh register 502 may provide an increased refresh frequency value. For example, an increased refresh frequency may be necessary in the event of cooling system malfunctions, environmental changes, or other events which would otherwise reduce the amount of time values are stable within an EDRAM macro.

The central refresh controller 500 further includes RTIM multiplexor 503 in communication with both the normal refresh register 501 and the fast refresh register 502. The RTIM multiplexor 503 facilitates selection between normal and fast refresh frequency values.

The central refresh controller further includes refresh period unit 504 in communication with the RTIM multiplexor 503. The unit 504 provides a refresh period based on the selected frequency. It is noted that the elements 501-504 may be single elements within the central refresh controller 500, while the remaining elements illustrated may be implemented once for each cache memory bank. For example, the central refresh controller may be sliced into portions representing each cache memory bank. Each of the sliced portions may include implementations of elements 505-511 described below, while elements 501-504 are common to all sliced portions. The description provided below thus is representative of a single cache memory bank, and the simplified illustration representing one sliced portion is intended to be illustrative only. It should be understood that several implementations of the elements 505-511 are necessary for cache refresh control of more than one cache bank.

Returning to FIG. 5, the refresh period from unit 504 is compared to a refresh count through comparator 505, the output of which is active when both inputs are equal, resulting in a single cycle pulse that is forwarded as a RTIM pulse to a refresh counter 507 where it resets the count to zero's, forcing the end of the current refresh interval and the beginning of the next. The output of the refresh counter 507 feeds a variable delay 506, and the variable delay 506 in turn provides the refresh count to the comparator 505. The variable delay 506 of each central refresh controller slice may be configured to each provide a different delay, such that refresh requests, and consequently refresh grants, are staggered. This may facilitate reduced noise due to staggering system refresh commands to versus simultaneously issuing refresh commands to all banks.

The central refresh controller 500 further includes refresh request latch 509 coupled to the comparator 505. The refresh request latch sets in response to a delayed RTIM pulse provided through comparator 505. The refresh request latch 509 transmits a refresh request in response to being set, and is reset upon receipt of a refresh grant from the bank availability model. The received refresh grant is transmitted as a refresh command to the bank controller through staging latch 511.

Hereinafter, methods of cache refresh are described in detail with reference to FIG. 6.

Figure 6:
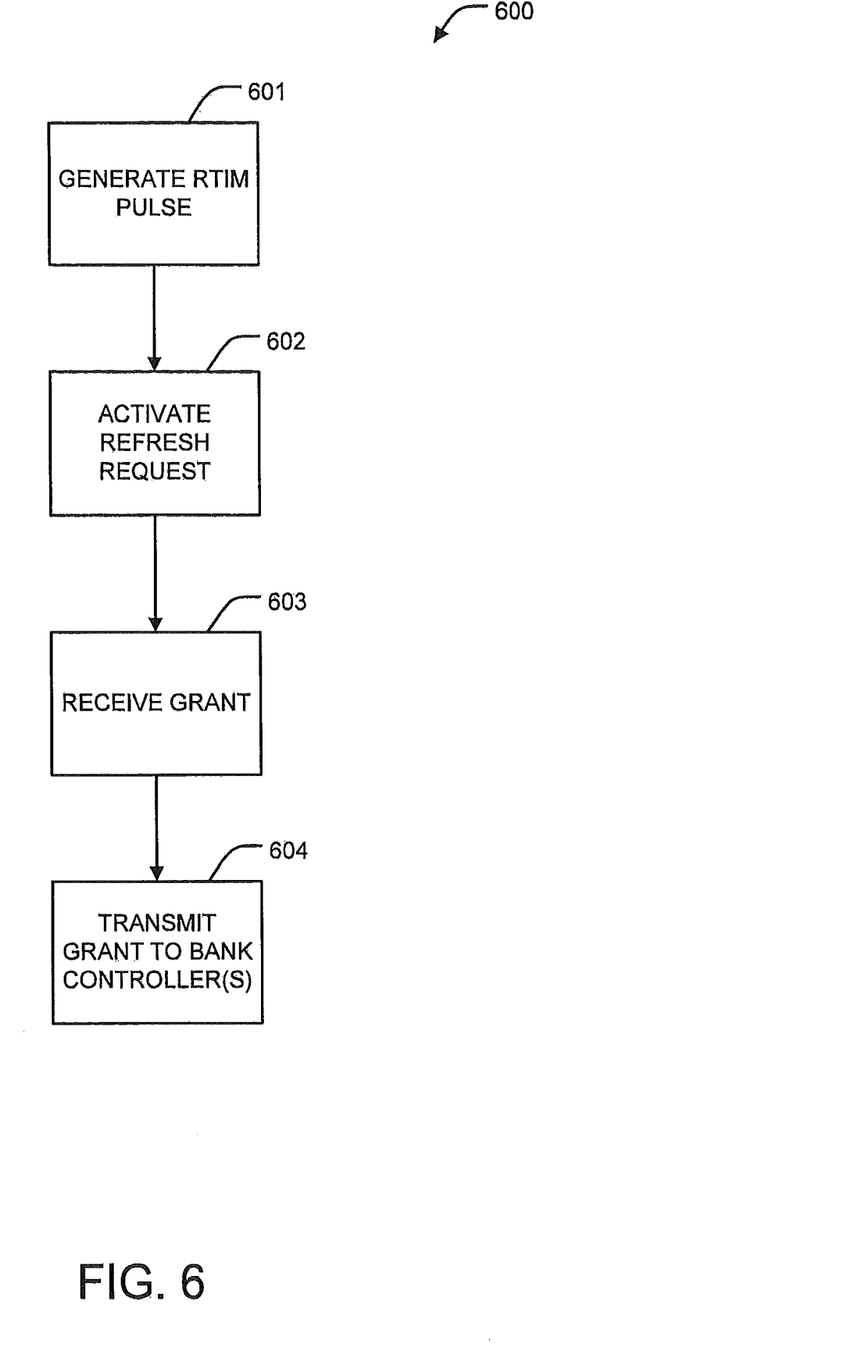
FIG. 6 depicts a method of cache refresh.

FIG. 6 depicts a method of cache refresh. The method 600 includes generating a refresh time period pulse (RTIM) at block 601. For example, the refresh time period pulse may be initiated at the beginning of a refresh time interval. A refresh time interval may be an interval during which all EDRAM macros must be refreshed to retain their contents. Thus, a central refresh controller may generate a refresh time pulse every N clock cycles, where N is the number of cycles contained in a selected refresh period register (e.g., normal refresh period register and/or fast refresh period register).

The method 600 further includes activating a refresh request in response to generating the pulse at block 602. For example, the refresh request may be activated through a refresh request latch in a central refresh controller. The refresh request may be associated with a single cache memory bank.

The method 600 further includes receiving a refresh grant in response to transmitting the refresh request at block 603. The refresh grant may be received from a bank availability model in communication with the central refresh controller issuing the refresh request.

The method 600 further includes transmitting the refresh grant to a bank controller at block 604. The bank controller may be associated, and localized, at a single cache memory bank of a cache memory. The bank controller, upon receiving the grant, may attempt to issue refresh commands to EDRAM macros of the single cache memory bank.

Figure 7:
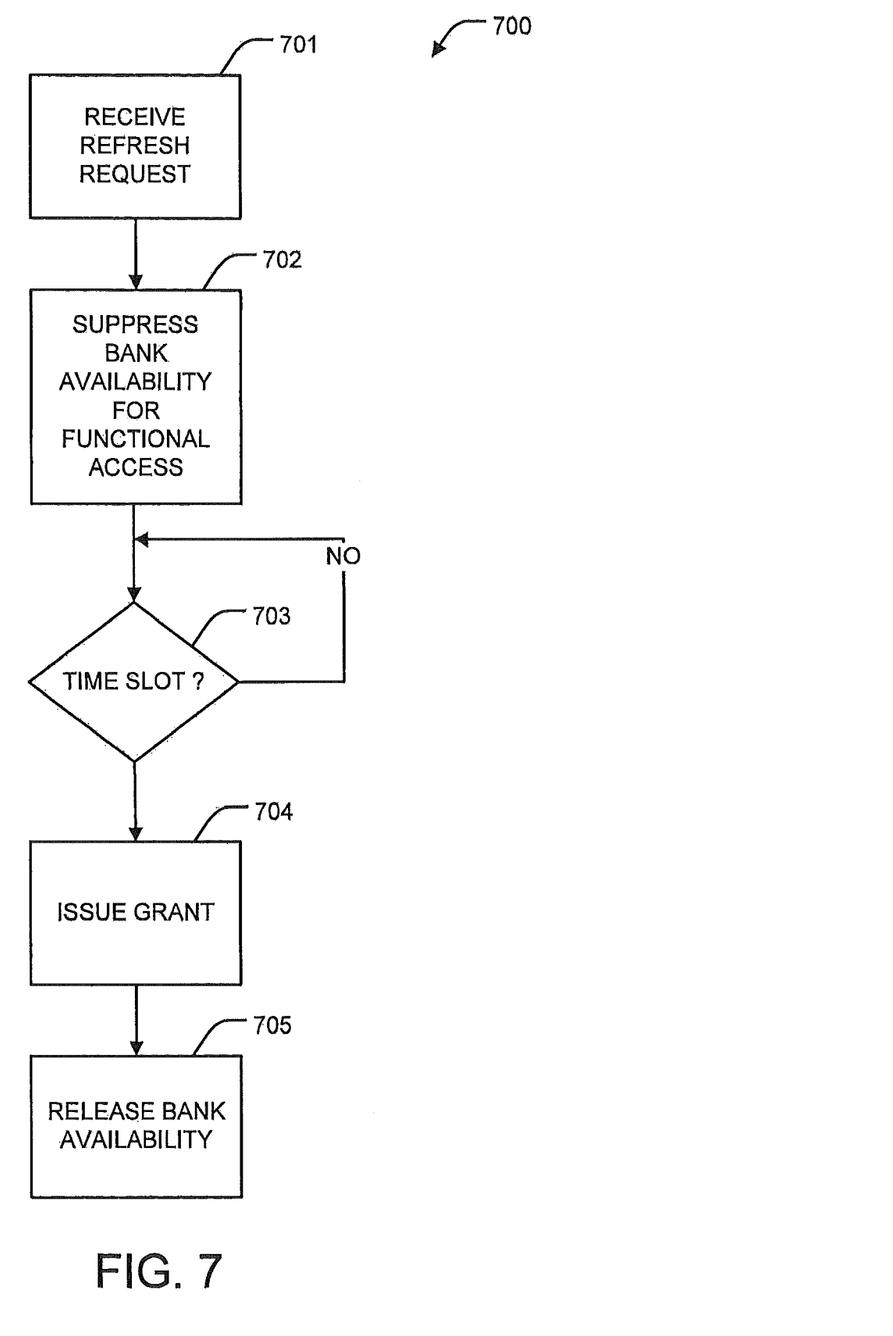
FIG. 7 depicts a method of cache refresh.

Hereinafter, a further method of cache refresh is described with reference to FIG. 7.

The method 700 includes receiving a refresh request at block 701. For example, the refresh request may be received at a bank availability model from a centralized refresh controller as described in FIG. 5.

The method 700 may further include suppressing bank availability at block 702. For example, the bank availability model, in response to receiving the refresh request from the centralized refresh controller, may suppress bank availability for functional access to the bank the refresh request is associated with.

Thereafter, the method 700 includes determining if there is a time slot available for a refresh grant at block 703. Upon acquiring the timeslot and granting the request at block 704, the bank availability model releases bank availability for functional access to continue at block 705 as normal. It is noted, that if functional access is halted for another reason through the bank availability model, full bank availability is not released until this situation is resolved. Therefore, it should be understood that release of bank availability at block 705 does not comprise blindly releasing availability, but releasing bank availability for normal operations within the bank availability model itself.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Figure 8:
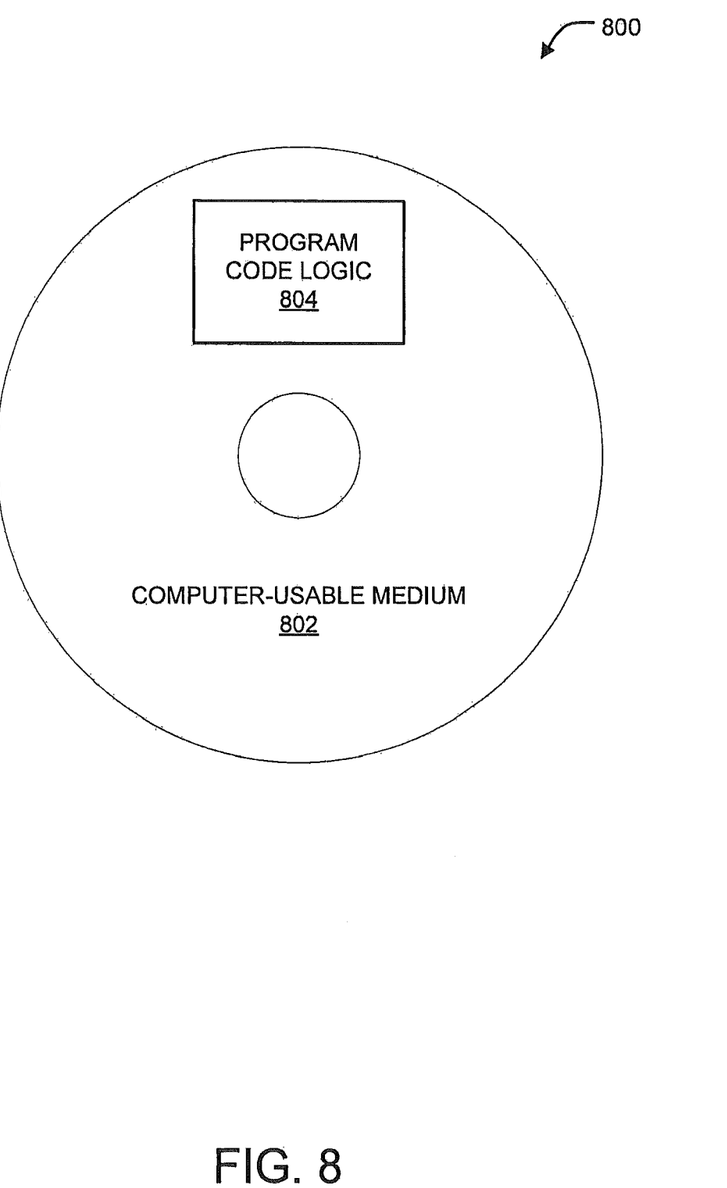
FIG. 8 depicts a computer program product.

As described above, embodiments can be embodied in the form of computer-implemented processes and apparatuses for practicing those processes. In exemplary embodiments, the invention is embodied in computer program code executed by one or more network elements. Embodiments include a computer program product 800 as depicted in FIG. 8 on a computer usable medium 802 with computer program code logic 804 containing instructions embodied in tangible media as an article of manufacture. Exemplary articles of manufacture for computer usable medium 802 may include floppy diskettes, CD-ROMs, hard drives, universal serial bus (USB) flash drives, or any other computer-readable storage medium, wherein, when the computer program code logic 804 is loaded into and executed by a computer, the computer becomes an apparatus for practicing the invention. Embodiments include computer program code logic 804, for example, whether stored in a storage medium, loaded into and/or executed by a computer, or transmitted over some transmission medium, such as over electrical wiring or cabling, through fiber optics, or via electromagnetic radiation, wherein, when the computer program code logic 804 is loaded into and executed by a computer, the computer becomes an apparatus for practicing the invention. When implemented on a general-purpose microprocessor, the computer program code logic 804 segments configure the microprocessor to create specific logic circuits.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The invention claimed is:

1. A computer implemented method of system refresh in a cache memory, the method comprising:
generating a refresh time period (RTIM) pulse by a specific refresh control slice portion of a centralized refresh controller of the cache memory, the refresh control slice portion being one of a plurality of refresh control slice portions of the centralized refresh controller;
activating a refresh request at the centralized refresh controller based on generating the RTIM pulse, the refresh request and the specific refresh control slice portion both associated with a single cache memory bank of a plurality of cache memory banks;
receiving the refresh request by a bank availability model from the centralized refresh controller based on activating the refresh request;
suppressing availability of functional access to the single cache memory bank based on the received refresh request by transmitting a bank availability vector from the bank availability model to a pipe request filtering unit;
determining that there is an available time slot for granting the refresh request based on information corresponding to a filtered refresh request received by the bank availability model from a pipe request arbitration unit;
issuing a refresh grant from the bank availability model to the centralized refresh controller based on the determining that there is an available time slot;
receiving the refresh grant by the centralized refresh controller;
transmitting the refresh grant from the centralized refresh controller to a bank controller, the bank controller associated, and localized, at the single cache memory bank of the plurality of cache memory banks; and
releasing, by the bank availability model, the suppression of the bank availability of functional access to the single cache memory bank based on the issuing the refresh grant.

2. The method of claim 1, further comprising generating, by the centralized refresh controller, a new RTIM pulse every N clock cycles, where N is a number of clock cycles of a predetermined refresh period.

3. The method of claim 2, further comprising determining the predetermined refresh period by selecting, by a RTIM multiplexor, one of a normal refresh register value and a fast refresh register value as the predetermined refresh period based on at least one of system operating voltage and system temperature of the cache memory.

4. The method of claim 1, further comprising generating a plurality of different RTIM pulses for a plurality of different bank controllers, each bank controller being local to, and associated with, only one cache memory bank of the cache memory, and each cache memory bank of the cache memory being associated with only one bank controller.

5. The method of claim 4, wherein the plurality of different RTIM pulses are staggered.

6. The method of claim 1, wherein the plurality of cache memory banks comprise a plurality of embedded dynamic random access memory (EDRAM) macros.

7. The method of claim 1, further comprising generating, by the centralized refresh controller, the RTIM pulse at the beginning of a refresh time interval.

8. The method of claim 7, wherein the RTIM pulse denotes the beginning of the refresh time interval during which all embedded dynamic random access memory (EDRAM) macros of the single cache memory bank must be refreshed to retain their contents.

9. A computer program product for system refresh in a cache memory, comprising:
a non-transitory tangible storage medium readable by a processing circuit and storing instructions for execution by the processing circuit for performing a method comprising:
generating a refresh time period (RTIM) pulse by a specific refresh control slice portion of a centralized refresh controller of the cache memory, the refresh control slice portion being one of a plurality of refresh control slice portions of the centralized refresh controller;
activating a refresh request at the centralized refresh controller based on generating the RTIM pulse, the refresh request and the specific refresh control slice portion both associated with a single cache memory bank of a plurality of cache memory banks;
receiving the refresh request by a bank availability model from the centralized refresh controller based on activating the refresh request;
suppressing availability of functional access to the single cache memory bank based on the received refresh request by transmitting a bank availability vector from the bank availability model to a pipe request filtering unit;
determining that there is an available time slot for granting the refresh request based on information corresponding to a filtered refresh request received by the bank availability model from a pipe request arbitration unit;
issuing a refresh grant from the bank availability model to the centralized refresh controller based on the determining that there is an available time slot;
receiving the refresh grant by the centralized refresh controller;
transmitting the refresh grant from the centralized refresh controller to a bank controller, the bank controller associated, and localized, at the single cache memory bank of the plurality of cache memory banks; and
releasing, by the bank availability model, the suppression of the bank availability of functional access to the single cache memory bank based on the issuing the refresh grant.

10. The computer program product of claim 9, further comprising generating, by the centralized refresh controller, the RTIM pulse at the beginning of a refresh time interval.

11. The computer program product of claim 10, wherein the RTIM pulse denotes the beginning of the refresh time interval during which all embedded dynamic random access memory (EDRAM) macros of the single cache memory bank must be refreshed to retain their contents.

12. The computer program product of claim 9, further comprising generating, by the centralized refresh controller, a new RTIM pulse every N clock cycles, where N is a number of clock cycles within a predetermined refresh period.

13. The computer program product of claim 12, further comprising determining the predetermined refresh period by selecting, by a RTIM multiplexor, one of a normal refresh register value and a fast refresh register value as the predetermined refresh period based on at least one of system operating voltage and system temperature of the cache memory.

14. The computer program product of claim 9, further comprising generating a plurality of different RTIM pulses for a plurality of different bank controllers, each bank controller being local to, and associated with, only one cache memory bank of the cache memory, and each cache memory bank of the cache memory being associated with only one bank controller.

15. The computer program product of claim 14, wherein the plurality of different RTIM pulses are staggered.

16. A system for refresh in a cache memory, comprising:
a plurality of cache memory banks;
a bank controller local to, and in communication with, the plurality of cache memory banks;
a centralized refresh controller in communication with the bank controller, the system configured to perform a method, comprising:
generating a refresh time period (RTIM) pulse by a specific refresh control slice portion of the centralized refresh controller of the cache memory, the refresh control slice portion being one of a plurality of refresh control slices portions of the centralized refresh controller;
activating a refresh request at the centralized refresh controller based on generating the RTIM pulse, the refresh request and the specific refresh control slice portion both associated with the a single cache memory bank of the plurality of cache memory banks;
receiving the refresh request by a bank availability model from the centralized refresh controller based on activating the refresh request;
suppressing availability of functional access to the single cache memory bank based on the received refresh request by transmitting a bank availability vector from the bank availability model to a pipe request filtering unit;
determining that there is an available time slot for granting the refresh request based on information corresponding to a filtered refresh request received by the bank availability model from a pipe request arbitration unit;
issuing a refresh grant from the bank availability model to the centralized refresh controller based on the determining that there is an available time slot;
receiving the refresh grant by the centralized refresh controller;
transmitting the refresh grant from the centralized refresh controller to the bank controller; and
releasing, by the bank availability model, the suppression of the bank availability of functional access to the single cache memory bank based on the issuing the refresh grant.

17. The system of claim 16, further comprising generating, by the centralized refresh controller, the RTIM pulse at the beginning of a refresh time interval.

18. The system of claim 17, wherein the RTIM pulse denotes the beginning of the refresh time interval during which all EDRAM macros of the single cache memory bank must be refreshed to retain their contents.

19. The system of claim 16, further comprising generating, by the centralized refresh controller, a new RTIM pulse every N clock cycles, where N is a number of clock cycles within a predetermined refresh period.

20. The system of claim 19, further comprising determining the predetermined refresh period by selecting, by a RTIM multiplexor, one of a normal refresh register value and a fast refresh register value as the predetermined refresh period based on at least one of system operating voltage and system temperature of the cache memory.

* * * * *